United States Patent
Miki et al.

(10) Patent No.: US 6,903,980 B2
(45) Date of Patent: Jun. 7, 2005

(54) NONVOLATILE SEMICONDUCTOR MEMORY DEVICE CAPABLE OF CORRECTING OVER-ERASED MEMORY CELLS

(75) Inventors: Katsuhiro Miki, Kasugai (JP); Takayuki Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/445,012

(22) Filed: May 27, 2003

(65) Prior Publication Data

US 2003/0227796 A1 Dec. 11, 2003

(30) Foreign Application Priority Data

Jun. 11, 2002 (JP) .......................... 2002-170149

(51) Int. Cl.[7] .......................... G11C 16/04; G11C 16/06; G11C 7/00

(52) U.S. Cl. .............................. 365/185.3; 365/185.23; 365/185.28; 365/185.33; 365/191; 365/201

(58) Field of Search ...................... 365/185.3, 185.23, 365/185.28, 185.33, 191, 201

(56) References Cited

U.S. PATENT DOCUMENTS

| | | | | |
|---|---|---|---|---|
| 6,496,417 B1 * | 12/2002 | Shiau et al. | ............. | 365/185.2 |
| 6,711,056 B2 * | 3/2004 | Abedifard et al. | ..... | 365/185.09 |
| 6,847,565 B2 * | 1/2005 | Abedifard et al. | ..... | 365/185.09 |
| 2001/0043492 A1 * | 11/2001 | Lee et al. | ............. | 365/185.29 |
| 2003/0021155 A1 * | 1/2003 | Yachareni et al. | ..... | 365/185.22 |
| 2003/0072182 A1 * | 4/2003 | Keays | ................... | 365/185.33 |
| 2003/0074152 A1 * | 4/2003 | Kessenich et al. | .......... | 702/117 |
| 2003/0206435 A1 * | 11/2003 | Takahashi | ................... | 365/173 |
| 2005/0028053 A1 * | 2/2005 | Roohparvar | ................ | 714/710 |

* cited by examiner

Primary Examiner—Hoai Ho
Assistant Examiner—Ly Duy Pham
(74) Attorney, Agent, or Firm—Arent Fox PLLC (57) ABSTRACT

A nonvolatile semiconductor memory device includes a memory cell array which includes nonvolatile memory cells, and a control circuit which responds to a first command by performing a first batch erasure with respect to a selected group of the memory cells, and responds to a second command by performing a second batch erasure with respect to the selected group of the memory cells, the first batch erasure including preprogramming, erasure, and over-erasure correction in this sequence, and the second batch erasure including over-erasure correction, preprogramming, erasure, and over-erasure correction in this sequence.

10 Claims, 8 Drawing Sheets

| COMMAND SEQUENCE | BUS WRITE CYCLE | 1st Add | 1st Data | 2nd Add | 2nd Data | 3rd Add | 3rd Data | 4th Add | 4th Data | 5th Add | 5th Data | 6th Add | 6th Data |
|---|---|---|---|---|---|---|---|---|---|---|---|---|---|
| NORMAL SECTOR ERASURE | 6 | 555H | AAH | 2AAH | 55H | 555H | 80H | 555H | AAH | 2AAH | 55H | 555H | 10H |
| CHIP SECTOR ERASURE | 6 | 555H | AAH | 2AAH | 55H | 555H | 80H | 555H | AAH | 2AAH | 55H | 555H | 30H |
| SECTOR ERASURE IN ERASURE-HANG-UP RECOVERY MODE | 6 | 555H | AAH | 2AAH | 55H | 555H | 80H | 555H | AAH | 2AAH | 55H | 555H | |
| CHIP ERASURE IN ERASURE-HANG-UP RECOVERY MODE | 6 | 555H | AAH | 2AAH | 55H | 555H | 80H | 555H | AAH | 2AAH | 55H | 555H | |

NONVOLATILE SEMICONDUCTOR MEMORY DEVICE CAPABLE OF CORRECTING OVER-ERASED MEMORY CELLS

CROSS-REFERENCE TO RELATED APPLICATIONS

The present application is based upon and claims the benefit of priority from the prior Japanese Patent Application No. 2002-170149 filed on Jun. 11, 2002, with the Japanese Patent Office, the entire contents of which are incorporated herein by reference.

BACKGROUND OF THE INVENTION

1. Field of the Invention

The present invention generally relates to nonvolatile semiconductor memory devices, and particularly relates to a nonvolatile semiconductor memory device that is programmable.

2. Description of the Related Art

In a nonvolatile semiconductor memory device that is programmable and performs erasure on a batch basis, all the data in a sector to be erased are first set to "0" by preprogramming, and, then, the sector is erased. After the erasure, over-erasure correction is performed to correct memory cells that were over-erased within the erased sector. In general, thresholds of memory cells are not identical to each other, but vary within some distribution. Memory cells after erasure may include memory cells that end up having negative thresholds because of over-erasure.

Such over-erased memory cells allow an electric current to run through all the time even when the word line is not activated, thereby disturbing read operations and causing malfunction. The over-erasure correction brings the thresholds of such memory cells back to the normal thresholds, thereby eliminating over-erased memory cells.

In the nonvolatile semiconductor memory device as described above, data stored in memory cells of an erased sector may have unknown data status if an erasure operation is halted by a power failure or the like. If there are no over-erased memory cells, an erasure command is entered again into the nonvolatile semiconductor memory device, thereby performing preprogramming, data erasure, and over-erasure correction so as to set the relevant sector in a properly erased state. Depending on the timing of a power failure or resetting during the erasure operation, however, the erasure operation may come to a halt while over-erased memory cells are present.

In such a case, an erasure command may be entered again into the nonvolatile semiconductor memory device, but a sufficient potential cannot be given to a data bus in respect of the over-erased memory cells. This results in a failure to properly write data during the preprogramming stage of the erasure operation. The time limit set for an erasure operation may thus come to an end, resulting in a device hang-up. If this is the case, an erasure operation will always result in a device hang-up no matter how many times erasure operations are performed. Such a nonvolatile semiconductor memory device cannot be used as a memory device any longer.

Accordingly, there is a need for a nonvolatile semiconductor memory device that allows over-erased memory cells to be recovered when the over-erased memory cells are created by the halt of an erasure operation.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a memory cell array which includes nonvolatile memory cells, and a control circuit which responds to a first command by performing a first batch erasure with respect to a selected group of the memory cells, and responds to a second command by performing a second batch erasure with respect to the selected group of the memory cells, the first batch erasure including preprogramming, erasure, and over-erasure correction in this sequence, and the second batch erasure including over-erasure correction, preprogramming, erasure, and over-erasure correction in this sequence.

The nonvolatile semiconductor memory device as described above responds to the first command by performing the first batch erasure that is an erasure process performed in a normal erasure mode, and responds to the second command by performing the second batch erasure that is an erasure process performed in an erasure-hang-up recovery mode. In the erasure operation with the erasure-hang-up recovery mode, over-erasure correction is performed first. That is, a check is made as to whether there are over-erased memory cells in the area that is subjected to erasure. If the check finds one or more over-erased memory cells, a write operation for over-erasure correction is repeated until the check passes an over-erasure correction verify.

Namely, a threshold of 0 V or a threshold larger than 0 V that sets aside some tolerance margin is used as the threshold for the over-erasure verify, thereby deciding whether there is an over-erased memory cell. If there is an over-erased memory cell, a write operation is performed to bring up the threshold to a verify range of properly erased memory cells. If all the relevant memory cells pass the over-erasure correction verify, there is no over-erased memory cell any longer.

Thereafter, preprogramming, erasure, and over-erasure correction are performed in this sequence in the same manner as in a normal erasure algorithm. This properly erases all the memory cells in the relevant area that include the over-erased memory cells created by a halt of an erasure operation.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
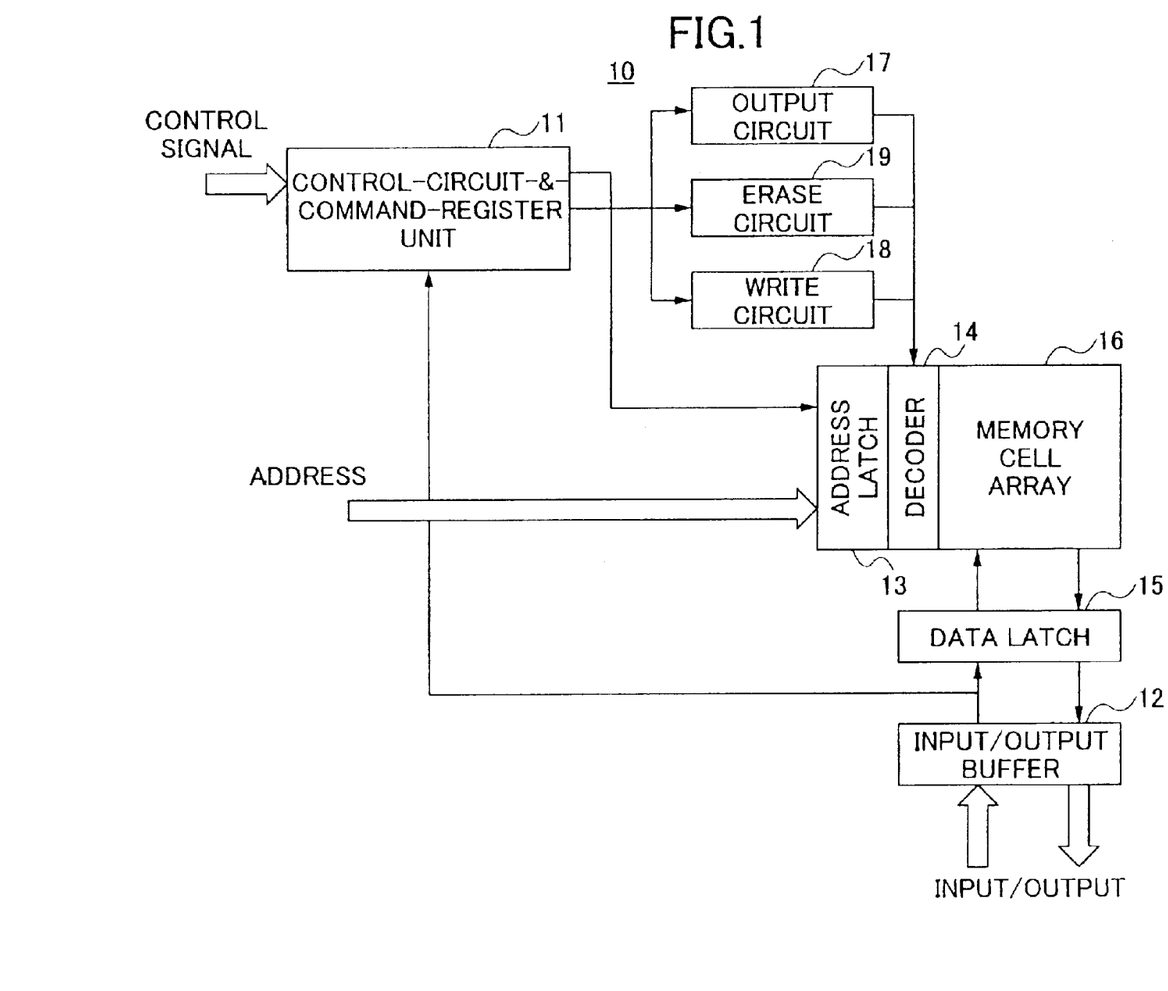
FIG. 1 is a block diagram showing the construction of a nonvolatile semiconductor memory device according to the present invention.

FIG. 1 is a block diagram showing the construction of a nonvolatile semiconductor memory device according to the present invention.

A nonvolatile semiconductor memory device 10 of FIG. 1 includes a control-circuit-&-command-register unit 11, an input/output buffer 12, an address latch 13, a decoder 14, a data latch 15, a memory cell array 16, an output circuit 17, a write circuit 18, and an erase circuit 19.

The control-circuit-&-command-register unit 11 receives control signals from the exterior of the device, and also receives a command from the exterior of the device where the command is represented by a combination of an address and data that are input through the input/output buffer 12 and the like. The control-circuit-&-command-register unit 11 operates as a state machine based on the control signals and command, thereby controlling the operation of each part of the nonvolatile semiconductor memory device 10.

The input/output buffer 12 receives data from the exterior of the device, and stores the data in the control-circuit-&-command-register unit 11 and in the data latch 15. The address latch 13 latches address signals supplied from the exterior of the device, and supplies these address signals to the decoder 14. The decoder 14 decodes the address supplied from the address latch 13, and activates a word line situated in the memory cell array 16 in response to the decoding results. Data that are retrieved to the bit lines of the memory cell array 16 are supplied to the data latch 15.

The memory cell array 16 includes an array of memory cell transistors, word lines, bit lines, etc., and store data in each memory cell transistor. At the time of data reading, data are read from memory cells specified by the activated word line, and are supplied to the bit lines. At the time of programming and erasing, word lines and bit lines are set to potentials suitable for respective operations, thereby injecting or removing electric charge into or from memory cells.

At the time of data reading, the data latch 15 compares a reference current of a reference cell with a data current that is supplied from the memory cell array 16. This provides the sensing of data as to whether it is 0 or 1. The sensed data is supplied as read data to the exterior of the device through the input/output buffer 12. Further, a verify check for the program operation and the erase operation is performed by comparing a reference current for the program verify or the erase verify with a data current supplied from the memory cell array 16.

The output circuit 17 drives the decoder 14 under the control of the control-circuit-&-command-register unit 11, and reads data from the memory cell array 16 in the case of a data read operation. The write circuit 18 drives the decoder 14 under the control of the control-circuit-&-command-register unit 11, and performs data writing in the memory cell array 16 based on the write data that is supplied to the data latch 15 from the input/output buffer 12.

The erase circuit 19 generates potentials that are applied to the word lines and bit lines at the time of erase operations, thereby carrying out a sector-specific erasure operation with respect to the memory cell array 16.

In the present invention, the control-circuit-&-command-register unit 11 responds to a command that specifies an erasure operation with the erasure-hang-up recovery mode, and performs an erasure operation that recovers from the conditions that lead to a hang-up. A normal erasure mode that is the same as a conventional erasure mode is also available. If a command specifying an erasure operation with the normal erasure mode is entered, the control-circuit-&-command-register unit 11 performs a normal, routine erasure operation.

Figure 2:
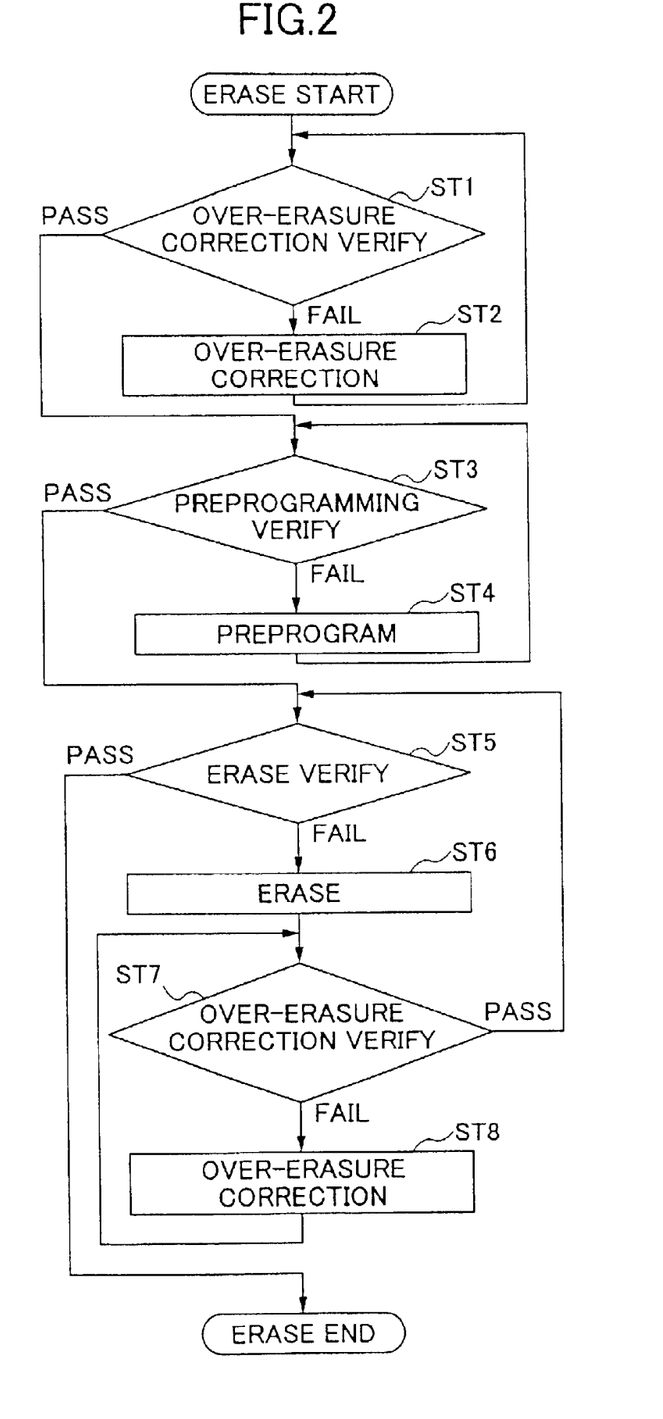
FIG. 2 is a flowchart showing an erasure operation with an erasure-hang-up recovery mode according to the present invention.

FIG. 2 is a flowchart showing an erasure operation with the erasure-hang-up recovery mode according to the present invention.

At step ST1 of FIG. 2, a verify operation is carried out for the purpose of over-erasure correction. Namely, a data current read from a memory cell is compared with a reference current for the over-erasure verify in order to determine whether there is an over-erased memory cell. If the memory cell subjected to data reading is determined to be an over-erased memory cell (FAIL), a write operation for over-erasure correction is performed at step ST2.

Figure 3:
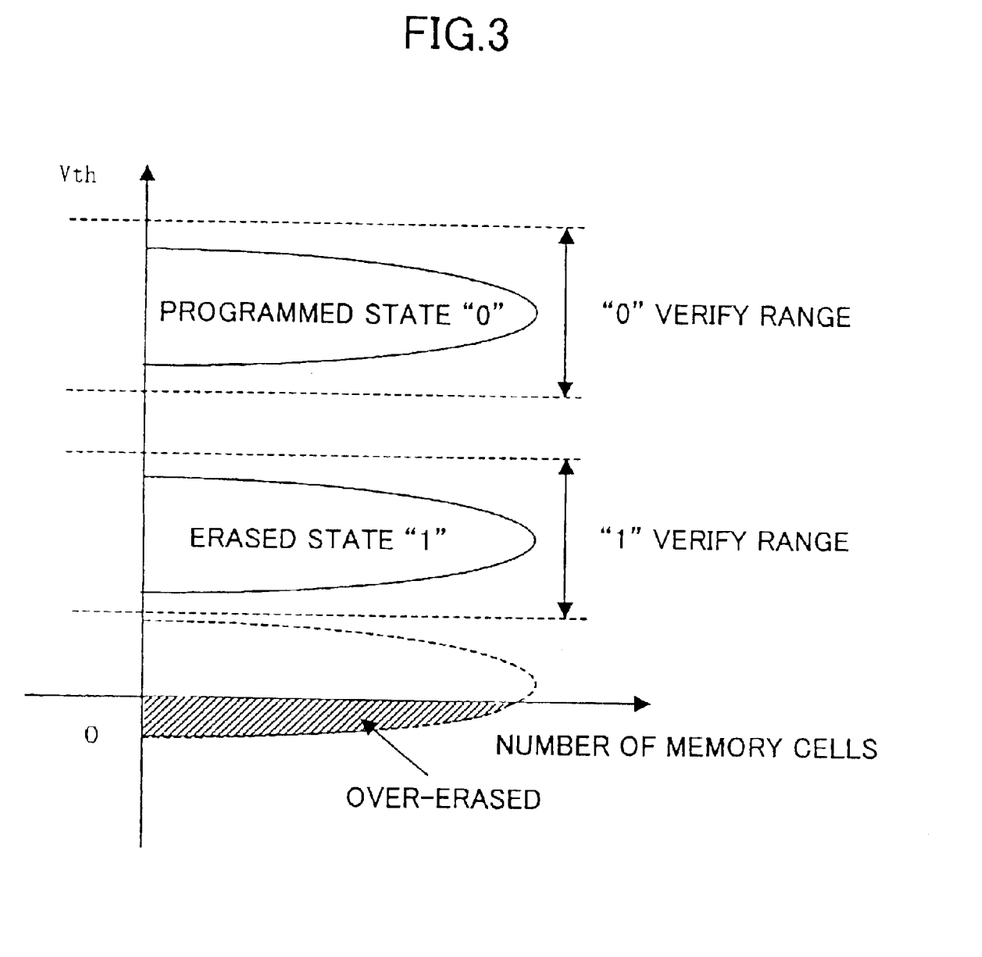
FIG. 3 is an illustrative diagram showing the thresholds of memory cells in various data states.

FIG. 3 is an illustrative diagram showing the thresholds of memory cells in various data states.

The vertical axis represents the threshold of memory cells, and the horizontal axis represents the number of memory cells. As shown in FIG. 3, memory cells in the data-written state have a threshold distribution that spreads within a "0" verify range. Further, memory cells in the data-erased state have a threshold distribution that spreads within a "1" verify range. These distributions are proper distributions. If an erasure operation comes to a halt due to a power failure or the like, memory cells may be placed in the over-erased state. Such over-erased memory cells have thresholds that are below 0 V as shown by hatches in FIG. 3.

In the erasure operation with the erasure-hang-up recovery mode according to the present invention, a check is made at step ST1 as to whether memory cells subjected to an erasure operation include an over-erased memory cell. If the check finds one or more over-erased memory cells, a write operation for over-erasure correction is repeated at step ST2 until the check passes the over-erasure correction verify.

Namely, a threshold of 0 V on the vertical axis as shown in FIG. 3 or a threshold larger than 0 V that sets aside some tolerance margin is used as the threshold for the over-erasure verify, thereby deciding whether there is an over-erased memory cell. If there is an over-erased memory cell, a write operation is performed to bring up the thresholds to the "1" verify range as shown in FIG. 3.

If all the memory cells subjected to the erasure operation passes the over-erasure correction verify, there is no over-erased memory cell any longer. A normal erasure algorithm will commence thereafter.

At step ST3, a preprogramming verify is performed as part of the normal erasure algorithm. If the verify fails, such a failure means that the relevant memory cells are not programmed, and, thus, preprogramming is performed at step ST4. If all the relevant memory cells pass the preprogramming verify, the procedure goes to step ST5.

At step ST5, an erase verify is performed. If it fails, such a failure means that some memory cells are not erased, and, thus, an erasure operation is carried out at step ST6 with respect to the relevant sector. At step ST7, an over-erasure correction verify is performed. At step ST8, an over-erasure correction operation is performed on the memory cells that failed the verify check at step ST7. When none of the memory cells in the relevant sector is over-erased, the check passes the verify at step ST7, so that the procedure goes back to step ST5, from where the erase verify and the following steps will be repeated.

If all the memory cells in the relevant sector pass the erase verify, the erasure operation comes to an end.

In the operations described above, processes performed after step ST3 are an erasure operation with the normal erasure mode, which is the same as a conventional erasure operation. In the present invention, the entry of a command indicative of an erasure operation with the erasure-hang-up recovery mode lets the procedure start from step ST1, thereby performing an erasure operation that corrects an erasure hang-up. The entry of a command indicative of an erasure operation with the normal erasure mode lets the procedure start from step ST3, thereby performing a normal, routine erasure operation.

Figure 4:
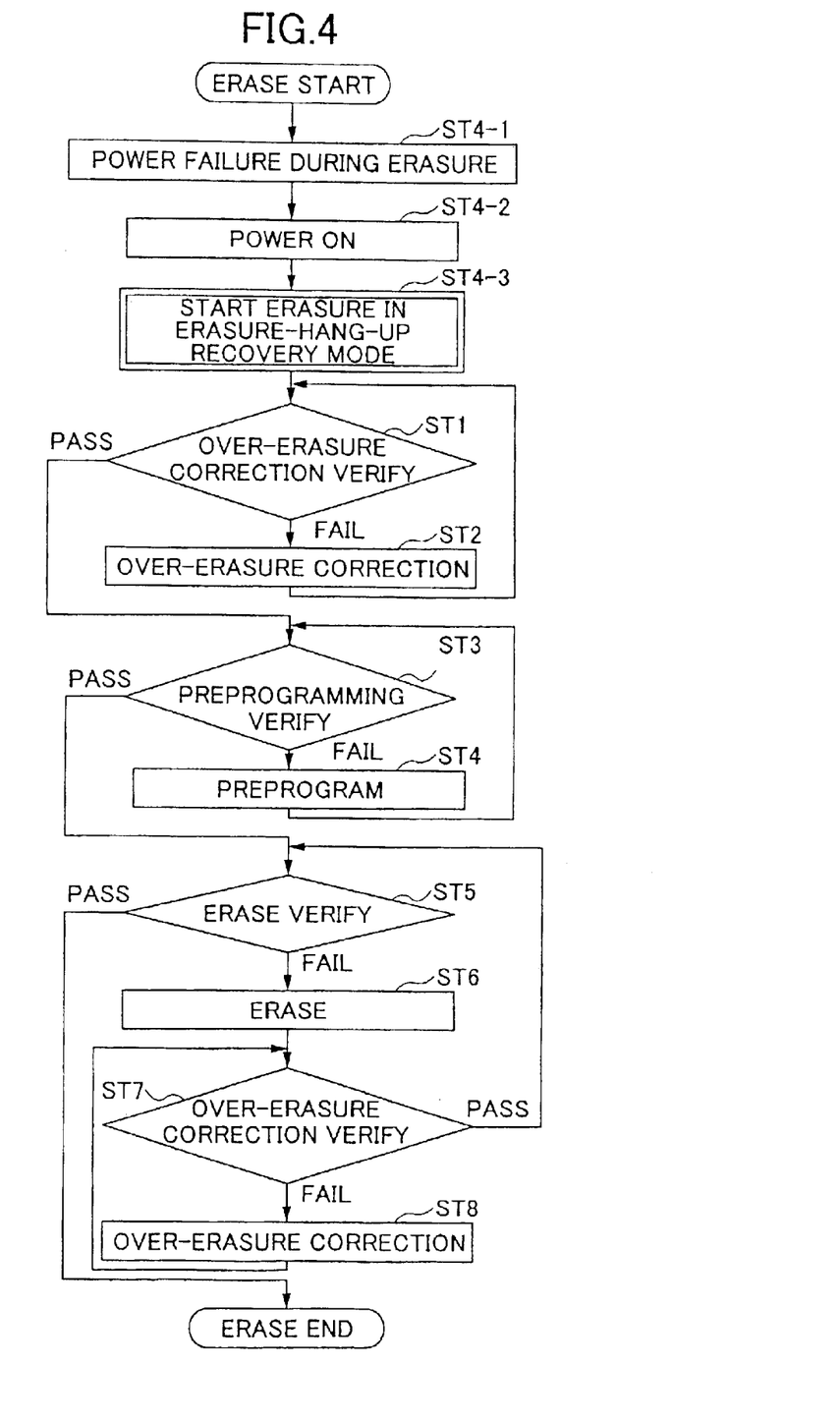
FIG. 4 is a flowchart for explaining a case in which an erasure operation with the erasure-hang-up recovery mode is performed after a power-failure that occurred during an erasure operation.

FIG. 4 is a flowchart for explaining a case in which an erasure operation with the erasure-hang-up recovery mode is performed after a power-failure that occurred during an erasure operation.

At step ST4-1 of FIG. 4, an erasure operation comes to a halt because of a power-failure or the like that occurs during the erasure operation. At step ST4-2, power is turned on, which prompts the nonvolatile semiconductor memory device to start an operation. At step ST4-3, a command is entered from the exterior of the device, which starts an erasure operation with the erasure-hang-up recovery mode. The following procedure is the same as the procedure that was described in connection with FIG. 2. That is, an over-erasure verify and over-erasure correction are performed at steps ST1 and ST2, followed by an erasure operation that is the same as a normal erasure operation. As a result, all the memory cells in the relevant sector can properly be erased, including over-erased memory cells that are created by the halt of the erasure operation at step ST4-1.

Figure 5:
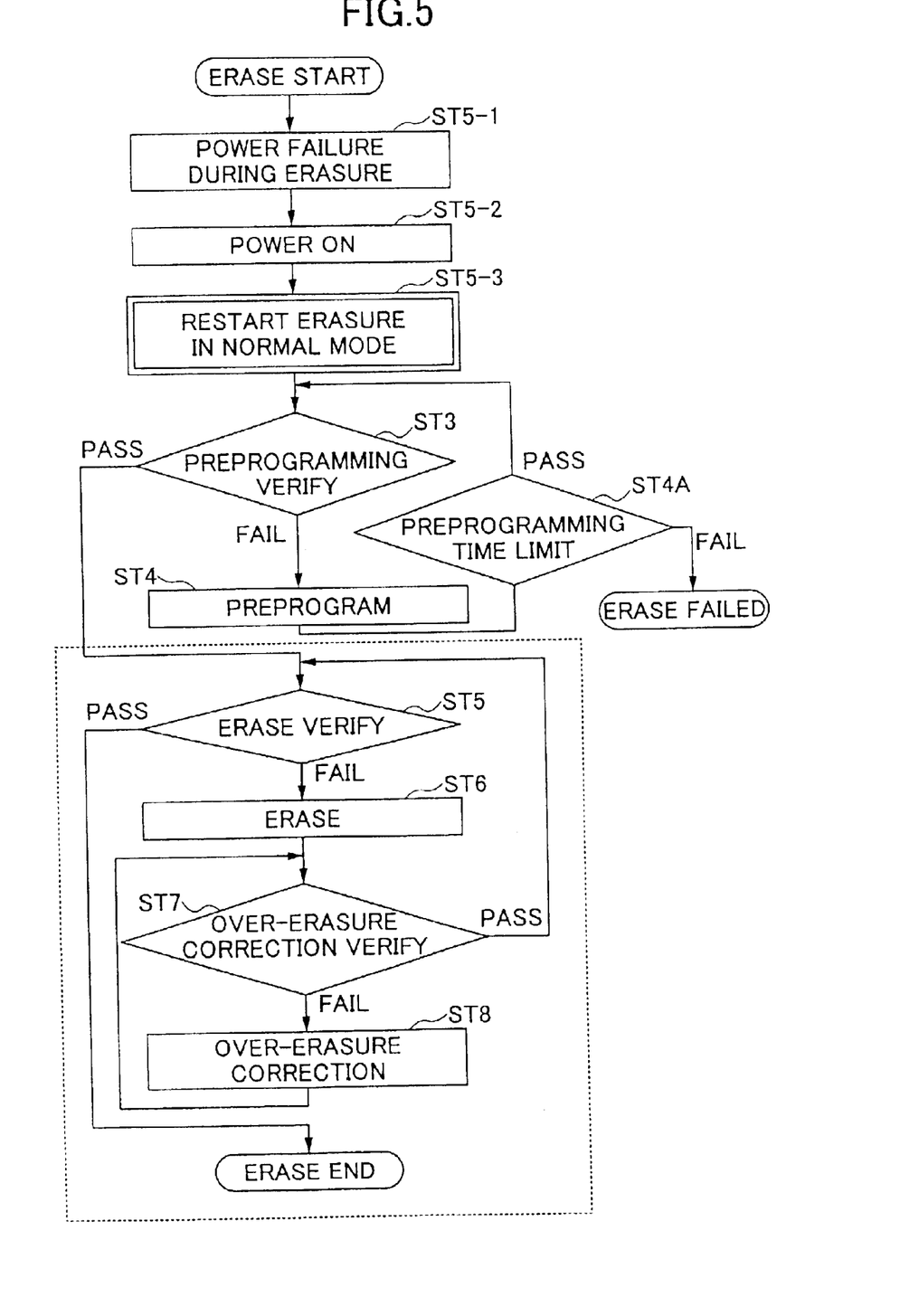
FIG. 5 is a flowchart for explaining a case in which an erasure operation with a normal erasure mode is performed after a power-failure that occurred during an erasure operation.

FIG. 5 is a flowchart for explaining a case in which an erasure operation with the normal erasure mode is performed after a power-failure that occurred during an erasure operation.

At step ST5-1 of FIG. 5, an erasure operation comes to a halt because of a power-failure or the like that occurs during the erasure operation. At step ST5-2, power is turned on, which prompts the nonvolatile semiconductor memory device to start an operation. At step ST5-3, a command is entered from the exterior of the device, which starts an erasure operation with the normal erasure mode. The erasure operation with the normal erasure mode corresponds to the procedure from step ST3 to step ST8 of the flowchart of FIG. 2.

The erasure operation with the normal erasure mode does not take into account the presence of over-erased memory cells, and performs a preprogramming verify (step ST3) and preprogramming (step ST4). At the preprogramming verify and preprogramming, a check is made as shown at step ST4A of FIG. 5 as to whether the end of a time limit has come. If the preprogramming is not completed within the time limit, the procedure comes to an end as being an erasure failure. That is, an erasure fails if the programming of an over-erased memory cell is not completed within the time limit. If the over-erased memory cell is not heavily over-erased, the procedure passes the preprogramming verify, and the following steps ST5 through ST8 will be properly carried out. In this case, the erasure operation comes to an end without any problem.

In FIG. 2 and FIG. 4, a check regarding the time limit of a preprogramming process is also made. By the time this preprogramming is performed, however, all the over-erased memory cells are already corrected, leaving no possibility of an erasure failure as in the case of FIG. 5. For those reasons, the step of a preprogramming time limit check (corresponding to ST4A of FIG. 5) is omitted from FIG. 2 and FIG. 4.

When an erasure operation with the normal operation mode is performed as in FIG. 5, the procedure does not pass a preprogramming verify because of an over-erased memory cell, resulting in an erasure failure due to exceeding the end of a time limit. In some cases, a normal write operation cannot cope with a strongly over-erased memory cell, so that the procedure fails at the preprogramming stage no matter how many times the erasure operation of FIG. 5 is repeated.

When an erasure operation with the normal erasure mode fails as in this case, an erasure operation with the erasure-hang-up recovery mode as shown in FIG. 4 is performed by entering a relevant command, thereby correcting over-erased memory cells. When it is known that an erasure operation is halted due to a power-failure or the like, an erasure operation with the erasure-hang-up recovery mode may be performed from the beginning by entering a relevant command.

Figure 6:
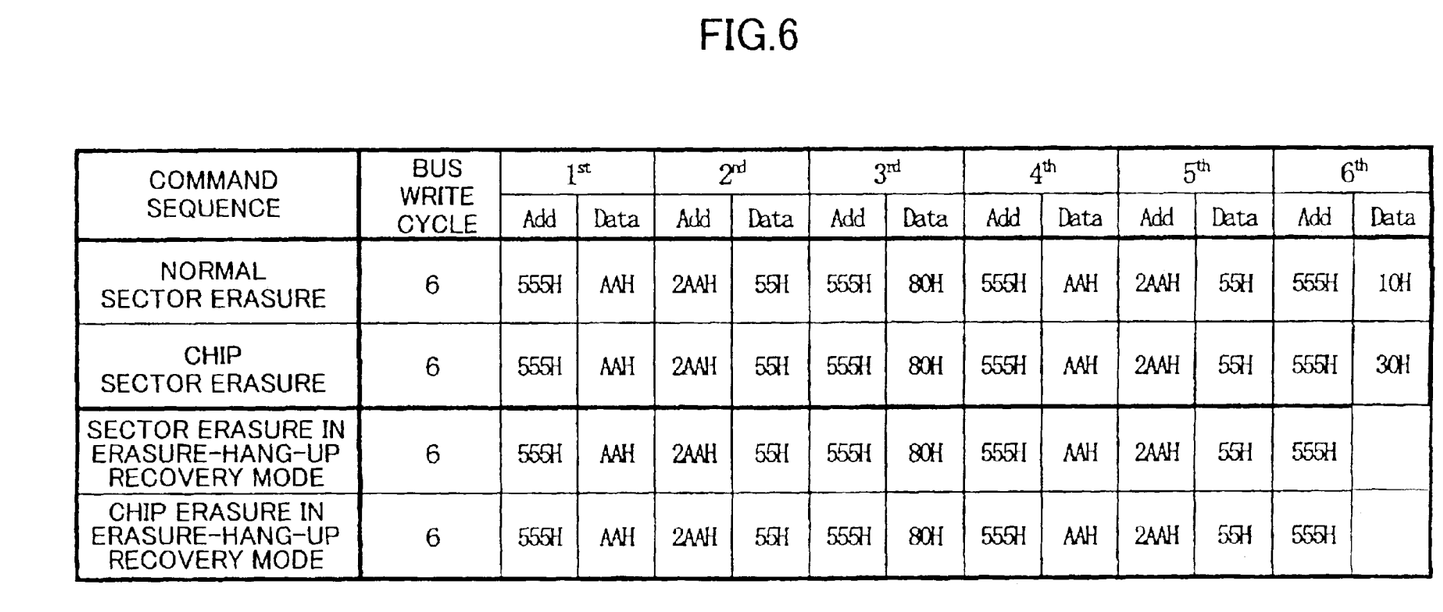
FIG. 6 is a table that shows the examples of an erasure command for the erasure-hang-up recovery mode and an erasure command for the normal erasure mode.

FIG. 6 is a table that shows the examples of an erasure command for the erasure-hang-up recovery mode and an erasure command for the normal erasure mode.

A sector erasure with the normal erasure mode is specified by a command by successively supplying predetermined address inputs Add and predetermined data inputs Data to a nonvolatile semiconductor memory device as shown in FIG. 6 from the first bus write cycle to the sixth bus write cycle. Further, a chip erasure with the normal erasure mode is specified by a command by replacing Data "10H" of the sector erasure with Data "30H" at the sixth bus write cycle.

A sector erasure with the erasure-hang-up recovery mode is specified by a command by providing the data input Data "11H" at the sixth bus write cycle. Other address inputs Add and data inputs Data are identical to those of the sector erasure or chip erasure with the normal erasure mode. Further, a chip erasure with the erasure-hang-up recovery mode is specified by a command by providing the data input Data "31H" at the sixth bus write cycle.

Figure 7:
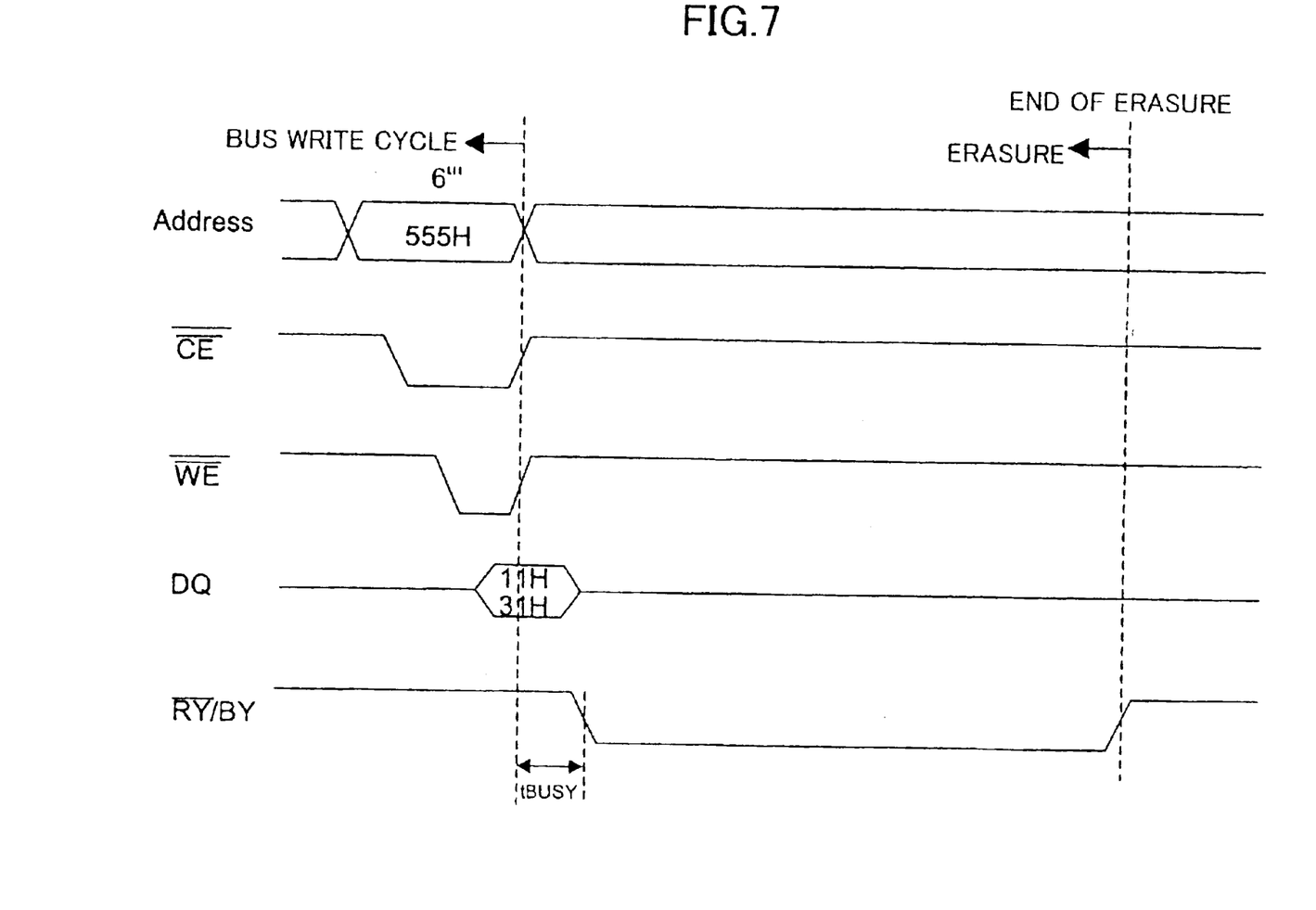
FIG. 7 is a timing chart for explaining the verify operation of an erasure process in the erasure-hang-up recovery mode.

FIG. 7 is a timing chart for explaining the verify operation of an erasure process in the erasure-hang-up recovery mode.

As shown in FIG. 7, an address input "555H" and a data input "11H" or "31H" are entered at the sixth bus write cycle (see FIG. 6). This indicates an erasure operation (sector erasure or chip erasure) with the erasure-hang-up recovery mode. When an erasure operation starts inside the nonvolatile semiconductor memory device chip, a ready/busy signal that is output from a ready/busy terminal RY/BY is changed from HIGH to LOW. During the erasure operation, the ready/busy signal remains at LOW. After the completion of the erasure operation, the ready/busy signal changes to HIGH.

Figure 8:
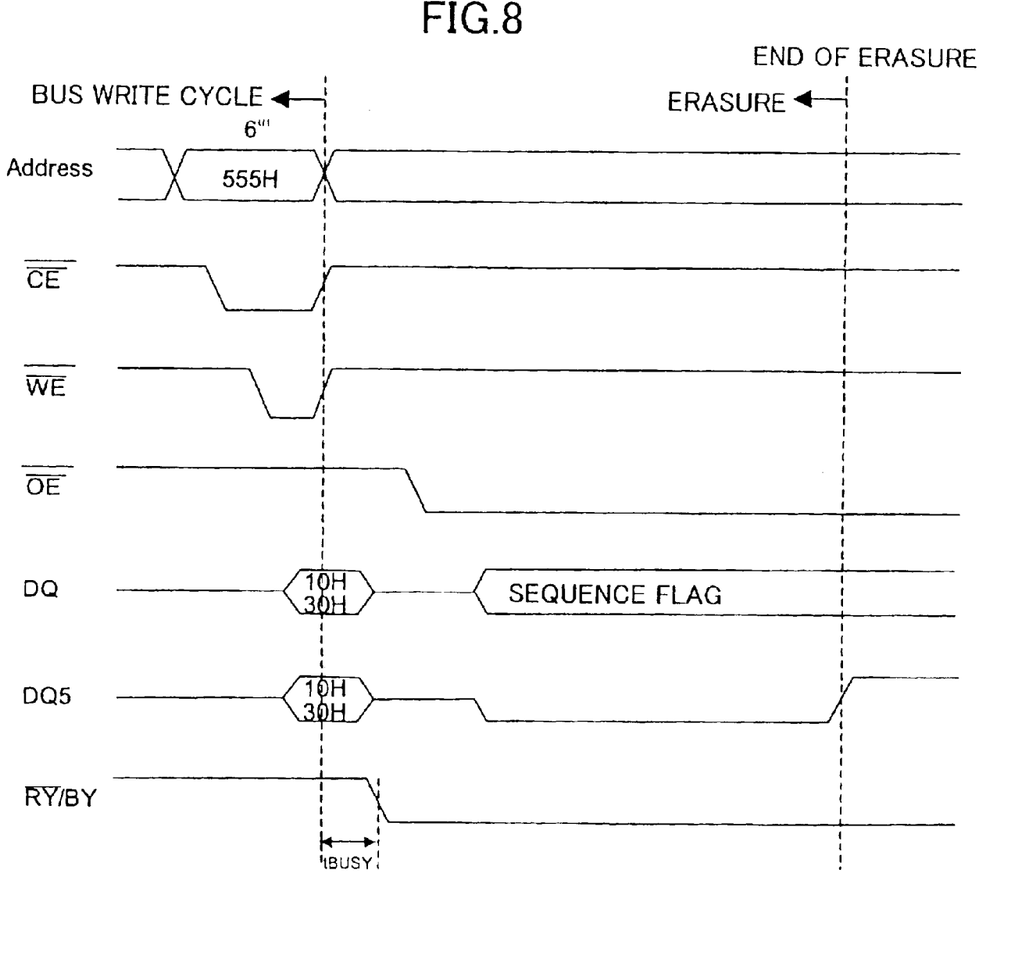
FIG. 8 is a timing chart showing the way a nonvolatile semiconductor memory device behaves when an erasure operation with the normal erasure mode is performed in the presence of an over-erased memory cell.

FIG. 8 is a timing chart showing the way a nonvolatile semiconductor memory device behaves when an erasure operation with the normal erasure mode is performed in the presence of an over-erased memory cell.

In order to perform an erasure operation with the normal erasure mode, an address input "555H" and a data input "10H" or "30H" are entered at the sixth bus write cycle (see FIG. 6). When an erasure operation starts inside the chip, the ready/busy signal that is output from the ready/busy terminal RY/BY is changed from HIGH to LOW. During the erasure operation, the ready/busy signal remains at LOW. A change to HIGH in the ready/busy signal responsive to the completion of the erasure operation is then awaited.

The example of FIG. 8 corresponds to a case in which an over-erased memory cell is present. Since the writing of the over-erased memory cell cannot properly be done during the preprogramming stage of the erasure operation, the ready/busy signal that is expected to signal the end of the erasure operation stays LOW without changing to HIGH. In such a case, an output of the fifth DQ terminal (DQ5) can be monitored to detect the exceeding of a preprogramming time limit. Namely, a change to HIGH of the output of the fifth DQ terminal (DQ5) indicates that the erasure operation has failed by exceeding the end of the preprogramming time limit. In this example, the output of the fifth DQ terminal indicates the exceeding of the preprogramming time limit. Alternatively, any other DQ terminal may be used for this purpose, or any currently unused terminal may be assigned a function to indicate the exceeding of a preprogramming time limit.

The outputting of a signal indicative of a device operation status as shown in FIG. 7 and FIG. 8 may be implemented by the control of the control-circuit-&-command-register unit 11.

In this manner, an output signal indicative of a chip internal operation status can be monitored when an erasure operation with the normal erasure mode is performed. Such monitoring makes it possible to detect the proper completion of an erasure operation or to detect the exceeding of a time limit cased by an over-erased memory cell. In the case of an erasure failure by exceeding the time limit, an erasure command with the erasure-hang-up recovery mode may be entered to properly erase all the relevant memory cells including the over-erased memory cells.

Further, the present invention is not limited to these embodiments, but various variations and modifications may be made without departing from the scope of the present invention.

What is claimed is:

1. A nonvolatile semiconductor memory device, comprising:
   a memory cell array which includes nonvolatile memory cells; and
   a control circuit which responds to a first command by performing a first batch erasure with respect to a selected group of said memory cells, and responds to a second command by performing a second batch erasure with respect to the selected group of said memory cells, said first batch erasure including preprogramming, erasure, and over-erasure correction in this sequence, and said second batch erasure including over-erasure correction, preprogramming, erasure, and over-erasure correction in this sequence, wherein said first batch erasure and said second batch erasure are independent of each other, and one of said first batch erasure and said second batch erasure is performed independently of the other batch erasure in response to a corresponding one of the first command and the second command entered into the device.

2. The nonvolatile semiconductor memory device as claimed in claim 1, wherein said control circuit outputs a signal to an exterior of said device, said signal indicating whether the preprogramming of said first batch erasure has failed.

3. The nonvolatile semiconductor memory device as claimed in claim 1, wherein said selected group of said memory cells is a sector.

4. The nonvolatile semiconductor memory device as claimed in claim 1, wherein said selected group of said memory cells is an entire chip.

5. The nonvolatile semiconductor memory device as claimed in claim 1, wherein said over-erasure correction includes an over-erasure verify operation for checking whether the memory cells are over-erased, and further includes a write operation for programming memory cells that are found to be over-erased by said over-erasure verify operation.

6. A method of erasing a nonvolatile semiconductor memory device, comprising the steps of:
   identifying a command that is supplied from an exterior of the device;
   performing a first batch erasure including preprogramming, erasure, and over-erasure correction in this sequence with respect to a selected group of nonvolatile memory cells in response to identifying of said command as a first command; and
   performing a second batch erasure including over-erasure correction, preprogramming, erasure, and over-erasure correction in this sequence with respect to the selected group of said nonvolatile memory cells in response to identifying of said command as a second command, wherein said first batch erasure and said second batch erasure are independent of each other, and one of said first batch erasure and said second batch erasure is performed independently of the other batch erasure in response to a corresponding one of the first command and the second command entered into the device.

7. The method as claimed in claim 6, further comprising a step of outputting a signal to an exterior of said device, said signal indicating whether the preprogramming of said first batch erasure has failed.

8. The method as claimed in claim 6, wherein said selected group of said nonvolatile memory cells is a sector.

9. The method as claimed in claim 6, wherein said selected group of said nonvolatile memory cells is an entire chip.

10. The method as claimed in claim 6, wherein said over-erasure correction includes:
    an over-erasure verify operation for checking whether the nonvolatile memory cells are over-erased, and
    a write operation for programming nonvolatile memory cells that are found to be over-erased by said over-erasure verify operation.

* * * * *